(12) United States Patent
Chavan et al.

(10) Patent No.: US 11,735,416 B2
(45) Date of Patent: Aug. 22, 2023

(54) ELECTRONIC DEVICES COMPRISING CRYSTALLINE MATERIALS AND RELATED MEMORY DEVICES AND SYSTEMS

(71) Applicant: Micron Technology, Inc., Boise, ID (US)

(72) Inventors: Ashonita A. Chavan, Boise, ID (US); Durai Vishak Nirmal Ramaswamy, Boise, ID (US); Michael Mutch, Meridian, ID (US); Sameer Chhajed, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 17/027,331

(22) Filed: Sep. 21, 2020

(65) Prior Publication Data

US 2021/0005451 A1   Jan. 7, 2021

Related U.S. Application Data

(62) Division of application No. 16/122,004, filed on Sep. 5, 2018, now Pat. No. 10,790,145.

(51) Int. Cl.
*H01L 21/02* (2006.01)
*H01L 27/12* (2006.01)
(Continued)

(52) U.S. Cl.
CPC .. *H01L 21/02592* (2013.01); *H01L 21/02532* (2013.01); *H01L 21/02667* (2013.01);
(Continued)

(58) Field of Classification Search
CPC ........... H01L 27/1222; H01L 21/02667; H01L 21/02592; H01L 29/78642
See application file for complete search history.

(56) References Cited

U.S. PATENT DOCUMENTS

| 3,966,513 A | 6/1976 | Hallais et al. |
| 4,767,585 A | 8/1988 | Holm et al. |

(Continued)

FOREIGN PATENT DOCUMENTS

| CN | 1442740 A | 9/2003 |
| CN | 1495848 A | 5/2004 |

(Continued)

OTHER PUBLICATIONS

Chinese First Office Action for Chinese Application No. 201910832688.2, dated Jan. 19, 2023, 20 pages with translation.

*Primary Examiner* — Nduka E Ojeh
(74) *Attorney, Agent, or Firm* — TraskBritt

(57) ABSTRACT

A method includes forming a first amorphous material, forming a second amorphous material over and in contact with the first material, removing a portion of the second material and the first material to form pillars, and exposing the materials to a temperature between a crystallization temperature of the first material and a crystallization temperature of the second material. The first material and the second material each comprise at least one element selected from the group consisting of silicon and germanium. The second material exhibits a crystallization temperature different than a crystallization temperature of the first material. Semiconductor structures, memory devices, and systems are also disclosed.

19 Claims, 6 Drawing Sheets

(51) Int. Cl.
*H01L 29/786* (2006.01)
*H01L 21/762* (2006.01)

(52) U.S. Cl.
CPC ........ *H01L 21/762* (2013.01); *H01L 27/1222* (2013.01); *H01L 27/1285* (2013.01); *H01L 29/78642* (2013.01)

(56) References Cited

U.S. PATENT DOCUMENTS

| | | | |
|---|---|---|---|
| 5,214,296 | A * | 5/1993 | Nakata .............. H01L 27/10817 257/302 |
| 5,471,331 | A | 11/1995 | Takizawa et al. |
| 5,543,187 | A | 8/1996 | Errico et al. |
| 5,612,230 | A | 3/1997 | Yuzurihara et al. |
| 6,080,998 | A | 6/2000 | Shima et al. |
| 6,326,248 | B1 | 12/2001 | Ohtani et al. |
| 6,737,307 | B2 | 5/2004 | Tsai et al. |
| 6,974,763 | B1 | 12/2005 | Zhang et al. |
| 7,029,995 | B2 | 4/2006 | Todd et al. |
| 7,501,331 | B2 | 3/2009 | Herner |
| 7,563,670 | B2 | 7/2009 | Cheng et al. |
| 8,062,963 | B1 | 11/2011 | Van Dal |
| 9,252,191 | B2 | 2/2016 | Clark et al. |
| 9,876,018 | B2 | 1/2018 | Chavan et al. |
| 2002/0066870 | A1 | 6/2002 | Koba |
| 2006/0030133 | A1 | 2/2006 | Agnello et al. |
| 2006/0208257 | A1 | 9/2006 | Branz et al. |
| 2007/0123062 | A1 | 5/2007 | Kang et al. |
| 2008/0057639 | A1 * | 3/2008 | Sandhu ............. H01L 27/11521 438/238 |
| 2008/0153214 | A1 | 6/2008 | Jung et al. |
| 2008/0182392 | A1 | 7/2008 | Yeh et al. |
| 2009/0176354 | A1 | 7/2009 | Rajendran et al. |
| 2009/0246460 | A1 | 10/2009 | Cho et al. |
| 2010/0078729 | A1 | 4/2010 | Fukutome et al. |
| 2013/0207226 | A1 | 8/2013 | Adam et al. |
| 2014/0264348 | A1 | 9/2014 | Tsai et al. |
| 2015/0159295 | A1 * | 6/2015 | Takahashi ............... C30B 1/023 117/200 |
| 2015/0190785 | A1 | 7/2015 | Mao et al. |
| 2015/0263097 | A1 * | 9/2015 | Cheng ............ H01L 21/823821 438/157 |
| 2015/0318381 | A1 * | 11/2015 | Tsai .................. H01L 29/66689 438/283 |
| 2017/0141227 | A1 * | 5/2017 | Jacob ............... H01L 21/823807 |
| 2017/0288056 | A1 * | 10/2017 | Balakrishnan ............................. H01L 21/823412 |
| 2018/0355213 | A1 | 12/2018 | Park et al. |
| 2019/0385677 | A1 | 12/2019 | Pillarisetty et al. |
| 2020/0075330 | A1 | 3/2020 | Chavan et al. |
| 2020/0075713 | A1 | 3/2020 | Mutch et al. |
| 2020/0075732 | A1 | 3/2020 | Mutch et al. |

FOREIGN PATENT DOCUMENTS

| | | | |
|---|---|---|---|
| CN | 1503327 A | 6/2004 | |
| CN | 1720356 A | 1/2006 | |
| CN | 1892984 A | 1/2007 | |
| CN | 101421837 A | 4/2009 | |
| CN | 104064448 A | 9/2014 | |
| CN | 106415868 A | 2/2017 | |
| EP | 2138609 A1 * | 12/2009 | ............ B82Y 10/00 |
| EP | 2138609 A1 | 12/2009 | |

* cited by examiner

ELECTRONIC DEVICES COMPRISING CRYSTALLINE MATERIALS AND RELATED MEMORY DEVICES AND SYSTEMS

CROSS-REFERENCE TO RELATED APPLICATIONS

This application is a divisional of U.S. patent application Ser. No. 16/122,004, filed Sep. 5, 2018, now U.S. Pat. No. 10,790,145, issued Sep. 29, 2020, the subject matter of which is related to the subject matter of U.S. patent application Ser. No. 16/121,928. "Methods of Forming Semiconductor Structures," filed Sep. 5, 2018, now U.S. Pat. No. 11,018,229, issued May 25, 2021, and U.S. patent application Ser. No. 16/121,966, "Methods of Forming Semiconductor Structures" filed Sep. 5, 2018, now U.S. Pat. No. 10,707,298, issued Jul. 7, 2020, the disclosure of each of which is hereby incorporated herein in its entirety by this reference.

FIELD

Embodiments of the disclosure relate to the field of semiconductor device design and fabrication. More specifically, embodiments of the present disclosure relate to semiconductor structures comprising crystalline materials, memory devices, and electronic systems, and to methods of forming the semiconductor structures.

BACKGROUND

Solid phase crystallization (SPC) and solid phase epitaxy (SPE) are conventionally used to form Si, SiGe, and Ge films for solid state electronics. However, controlling grain growth can be a problem for process integration because grain boundaries may occur in unwanted locations, which limit device performance and reliability.

In SPC, a film of homogeneous amorphous material is formed having a uniform crystallization temperature ($T_c$). Upon heating to a temperature above the $T_c$, nucleation occurs at random locations throughout the film, and the material crystallizes starting at the nucleation sites. Eventually, grain boundaries form at interfaces where different crystalline structures meet. These grain boundaries may occur randomly throughout the film. When the film is subsequently patterned into pillars, the pillars include the undesirable grain boundaries and different crystalline structures.

In SPE, a film stack is formed having sections of material having varying crystallization temperatures. As the stack is heated above the $T_c$ of one section, crystallization begins. The material with a lower $T_c$ can "seed" crystallization of the material with the higher $T_c$. The material can then be patterned to form pillars. The benefit of this method is that crystallization can be performed at relatively lower temperature. However, it is difficult to control properties of the materials because the resulting pillars contain random orientation of grains and grain boundaries. Such grain boundaries may limit the use of these materials in certain applications, such as vertical thin-film transistors (TFTs).

DETAILED DESCRIPTION

Figure 1:
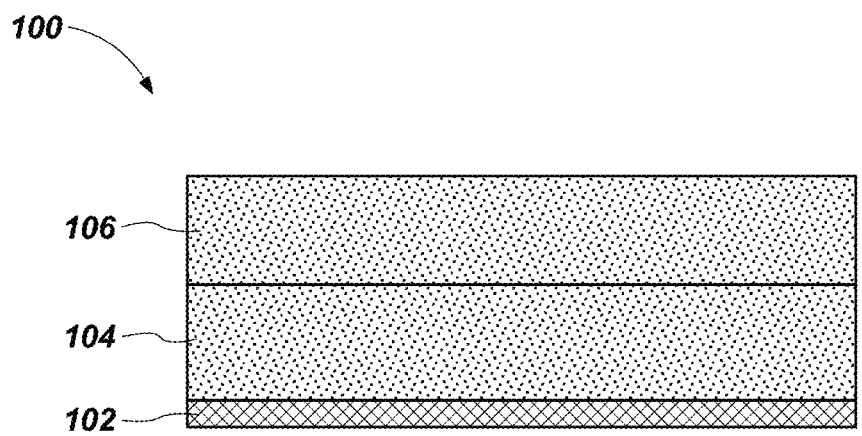
FIG. 1 is a simplified cross-sectional view illustrating a structure formed in a method according to embodiments of the disclosure.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, at least 99.9% met, or even 100.0% met.

As used herein, the term "about" in reference to a given parameter is inclusive of the stated value and has the meaning dictated by the context (e.g., it includes the degree of error associated with measurement of the given parameter).

Generally, a method as disclosed herein includes forming at least two amorphous materials, forming pillars from the amorphous materials, and exposing the amorphous materials to a temperature between the crystallization temperatures of the materials. The method enables crystallization of both materials at a temperature below a crystallization temperature of the material with a higher crystallization temperature.

FIG. 1 is a simplified cross-sectional view illustrating a base material 102 (e.g., a substrate) over which a first material 104 has been formed. The base material 102 may be or include Si, Ge, or Si and Ge in any ratio (i.e., $Si_{1-x}Ge_x$, where x is between 0 and 1). The base material 102 may be undoped or may be doped (e.g., including one or more dopants, such as arsenic, phosphorus, boron, etc., or combinations thereof). In some embodiments, the base material 102 is crystalline silicon, such as polycrystalline silicon. In other embodiments, the base material 102 is crystalline germanium. In yet other embodiments, the base material 102 is crystalline silicon-germanium. In some embodiments, the base material 102 may be omitted, or the first material 104 may itself be the structure upon which subsequent materials are formed.

The first material 104 may be formed using one or more of a growth process and a deposition process. By way of non-limiting example, the first material 104 may be formed using one or more of an in-situ growth process, a physical vapor deposition ("PVD") process, a chemical vapor deposition ("CVD") process, a metallorganic chemical vapor deposition ("MOCVD") process, a plasma-enhanced chemical vapor deposition (PECVD) process, an atomic layer deposition ("ALD") process, a spin-coating process, and a blanket coating process. In-situ growth processes include, but are not limited to, epitaxial growth processes, such as atomic layer epitaxy (ALE), pulsed atomic layer epitaxy (PALE), molecular beam epitaxy (MBE), gas source MBE, organometallic MBE, and chemical beam epitaxy (CBE). PVD processes include, but are not limited to, one or more of sputtering, evaporation, and ionized PVD. The process utilized to form the first material 104 may at least partially depend on the material properties of the first material 104 and the base material 102 (if any) or any other material in the structure.

In some embodiments, the base material 102 may be placed in a vacuum chamber and maintained at a deposition temperature (e.g., less than about 600° C., less than about 500° C., etc.). One or more gaseous precursors to the first material 104 may be provided to the vacuum chamber, and may react to form the first material 104. The first material 104 may have a different composition from the composition of the base material 102. The first material 104 may be or include Si, Ge, or Si and Ge in any ratio (i.e., $Si_{1-x}Ge_x$, where x is between 0 and 1), and, optionally, one or more dopants, and may be formed in an amorphous form. For example, the first material 104 may include SiGe, $Si_4Ge$, $SiGe_4$, or any other ratio of Si to Ge. Dopants may be added to change the electrical properties of the first material 104, and may include, for example, boron, arsenic, phosphorus, etc.

The first material 104 may have be formed at a thickness up to about 10 μm, such as between about 25 Å and about 5 μm, or between about 100 Å and 1,000 Å (1 μm).

A second material 106 may be formed over and in contact with the first material 104 to form a structure 100. The second material 106 may have a different composition from the composition of the first material 104, in that the material composition differs in the element(s) of the composition or in the ratio of elements of the composition. Alternatively, the first and second materials 104, 106 may have the same composition.

The second material 106 may be formed in an amorphous form, and may be or include Si, Ge, or Si and Ge in any ratio (i.e., $Si_{1-x}Ge_x$, where x is between 0 and 1), and optionally, one or more dopants. The second material 106 may be formed by methods described above with respect to the first material 104. The second material 106 may exhibit a composition different from the composition of the first material 104, and exhibit a crystallization temperature (i.e., the temperature at which a phase transition from amorphous to crystalline begins) lower than a crystallization temperature of the first material 104. However, in other embodiments, the second material 106 may exhibit a crystallization temperature higher than the crystallization temperature of the first material 104.

The second material 106 may be formed at a thickness up to about 10 μm, such as between about 25 Å and about 5 μm, or between about 100 Å and 1,000 Å (1 μm).

Figure 2:
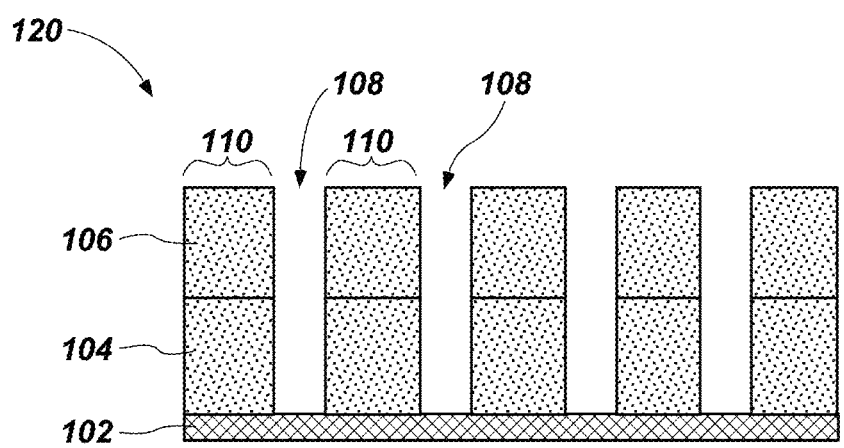
FIG. 2 is a simplified cross-sectional view illustrating the structure of FIG. 1, from which some material has been removed according to embodiments of the disclosure.

Portions of the second material 106 and the first material 104 may be removed to form a structure 120, shown in FIG. 2, having one or more openings 108 that define pillars 110. The removal of the first and second materials 104, 106 may be conducted by any suitable technique including, but not limited to, etching, abrasive planarization (e.g., chemical-mechanical planarization), or other known methods unless the context indicates otherwise. Each pillar 110 includes a portion of the second material 106 over and in contact with a portion of the first material 104. The pillars 110 may have a lateral dimension (e.g., a width) between about 5 Å and about 1,000 Å. The openings 108 may form parallel lines when viewed from above, and may separate the pillars 110 from one another.

Figure 3:
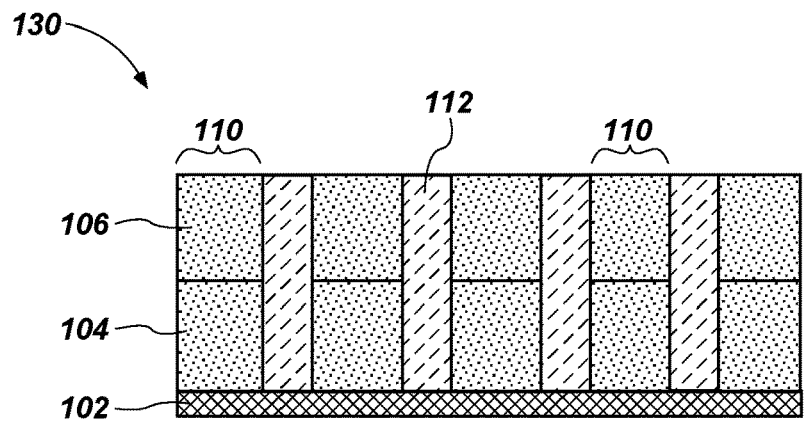
FIG. 3 is a simplified cross-sectional view illustrating the structure of FIG. 2, to which a blocking material has been added according to embodiments of the disclosure.

In some embodiments, and as shown in FIG. 3, a structure 130 may be formed by forming a blocking material 112 within the openings 108 and between adjacent pillars 110 to electrically isolate and protect the pillars 110 (e.g., by providing lateral support to the pillars 110 during subsequent processing). The blocking material 112 may include, for example, a dielectric material, such as an oxide, a nitride, a carbon-containing material, or another material, and may have a high dielectric constant (k) or relative permittivity. For example, the blocking material 112 may have a dielectric constant from about 1 to about 100. In some embodiments, the blocking material 112 may include, but is not limited to, a carbon film, $Al_2O_3$, $ZrO_x$, $SiO_2$, SiN, etc.

The blocking material 112 may be formed within the openings 108 using one or more of a growth process and a deposition process. In certain embodiments, the blocking material 112 may be formed by oxidizing a surface of the second material 106 and first material 104 within the openings 108. In other embodiments, the blocking material 112 may be omitted.

Figure 4:
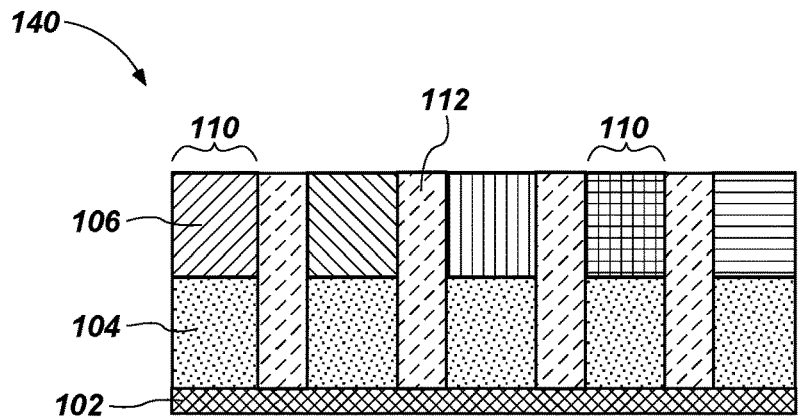
FIG. 4 is a simplified cross-sectional view illustrating the structure of FIG. 3, after annealing for a period of time in a method according to embodiments of the disclosure.

The structure 130 shown in FIG. 3 may be exposed to a temperature (e.g., an anneal temperature) above the crystallization temperature of the second material 106 and below the crystallization temperature of the first material 104 to form the structure 140 shown in FIG. 4. For example, the structure 130 may be annealed by subjecting the structure 130 to a temperature of less than about 650° C., less than about 600° C., less than about 550° C., less than about 500° C., or even less than about 450° C.

When exposed to the anneal temperature, the second material 106 may convert from amorphous to crystalline form. The crystalline structure of the second material 106 may begin to form at various nucleation sites (e.g., near the top of the second material 106 in the orientation shown in FIG. 3), and may propagate through the second material 106 in a direction of the crystalline grain. Even if more than one nucleation site develops within a single pillar 110, one resulting crystal structure may be formed predominantly over the other(s) by growing faster in a direction parallel with an axis of the pillar 110, such that throughout the second material 106 and at the interface between the first material 104 and the second material 106, there may be only one crystalline structure per pillar 110.

Figure 5:
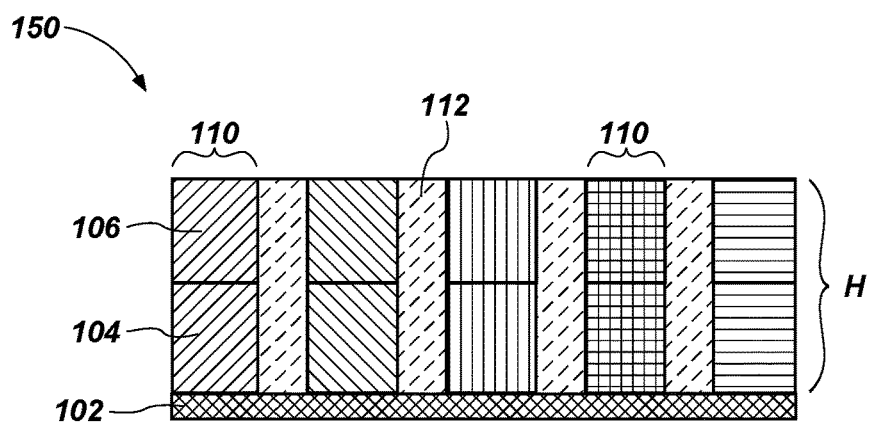
FIG. 5 is a simplified cross-sectional view illustrating the structure of FIG. 4, after annealing for an additional period of time, according to embodiments of the disclosure.

Maintaining the structure 140 at the anneal temperature (e.g., the anneal temperature below the crystallization temperature of the first material 104) may cause the first material 104 to crystallize. In particular, the second material 106 may "seed" or provide a template from which the first material 104 can form a crystalline structure at a certain orientation and form the semiconductor structure 150 shown in FIG. 5. The crystalline structure and orientation of the second material 106 may propagate into and through the first material 104. If the second material 106 exhibits a single crystalline structure and orientation at its interface with the first material 104, the first material 104 may form in a single crystalline structure and orientation. The blocking material 112 (if present) or openings 108 prevent the crystalline structure and orientation of adjacent pillars 110 from propagating to one another. Therefore, the first material 104 and second material 106 of a pillar 110 may exhibit a single crystalline structure and orientation along a height thereof. One or more of the pillars 110 may exhibit a different crystalline structure and orientation than that of adjacent pillars 110 (e.g., a different grain orientation) or the pillars 110 may exhibit substantially the same crystalline structure and orientation.

Therefore, the first material 104 may form a continuous crystalline structure with at least a portion of the second material 106, and may not form an interface or break within the crystalline structure of the first material 104 of a single pillar 110. That is, a portion of the second material 106 adjacent the first material 104 may exhibit the same crystalline structure (e.g., the same grain structure and orientation) as the first material 104.

Since the pillars 110 are formed (e.g., etched) before the first material 104 and the second material 106 are converted to their crystalline forms, the individual pillars 110 constrict the grain growth and crystal orientation within each pillar 110. With the pillars 110 separated from one another by the openings 108 or the blocking material 112, the grain growth and crystal orientation of one pillar 110 does not propagate to adjacent pillars 110. Since the pillars 110 constitute a smaller volume than the volume of the first and second materials 104, 106 before the pillar 110 formation, it is possible to form one predominant crystal structure within each pillar 110. Following the anneal, each of the pillars 110 may be substantially crystalline, with the pillars 110 exhibiting the same or different crystalline structure and orientation.

Accordingly, a method includes forming a first amorphous material, forming a second amorphous material over and in contact with the first amorphous material, removing a portion of the second amorphous material and the first amorphous material to form pillars, and exposing the first amorphous material and the second amorphous material to a temperature between a crystallization temperature of the first amorphous material and a crystallization temperature of the second amorphous material. The first amorphous material and the second amorphous material each comprise at least one element selected from the group consisting of silicon and germanium. The second amorphous material exhibits a crystallization temperature different than a crystallization temperature of the first amorphous material. Each pillar comprises a portion of the second amorphous material over and in contact with a portion of the first amorphous material. Exposure of the materials to the temperature may typically cause crystallization of both the first amorphous material and the second amorphous material.

Accordingly, in some embodiments, methods disclosed herein include annealing a structure comprising pillars. Before annealing, each pillar comprises a first amorphous material and a second amorphous material, wherein the first amorphous material and the second amorphous material each comprise at least one element selected from the group consisting of silicon and germanium. The annealing comprises subjecting the structure to a temperature between a crystallization temperature of the first amorphous material and a crystallization temperature of the second amorphous material. The annealing typically forms the pillars to have a single crystalline structure in the material formed from the first amorphous material.

The methods disclosed herein may be used to form the semiconductor structure 150 having the pillars 110 of a substantially continuous single crystalline material (i.e., the first material 104 and second material 106) having a height H of at least about 400 Å. The height H may be greater than a height at which the material can be conventionally formed entirely in single crystalline form at the annealing temperature. For example, the material of the pillars may be formed at a height H of at least about 600 Å, at least about 1,000 Å, or even up to 10 μm. Single crystalline pillars of such heights are difficult or impossible to produce reliably at temperatures that do not damage certain electronic components (e.g., temperatures of 600° C. or less). The semiconductor structure 150 formed as described above may be substantially free of amorphous material, e.g., amorphous silicon and germanium. The pillars 110 may be suitable for use in applications in which single-crystalline material is beneficial. For instance, the semiconductor structure 150 may be suitable for use in transistors (e.g., vertical thin-film transistors (TFTs)), in which uniformity of crystalline structure is desired. The pillars 110 of the semiconductor structure 150 may correspond to a channel region of a transistor, with a source region and a drain region coupled to the channel region.

Accordingly, in some embodiments, a semiconductor structure includes crystalline pillars laterally isolated from each adjacent pillar. Each crystalline pillar comprises a portion of a first material and a portion of a second material over and in contact with the portion of the first material. Each of the first material and the second material comprise at least one element selected from the group consisting of silicon and germanium, and the second material exhibits a composition different than a composition of the first material. The portion of the second material in each pillar is in single crystalline form.

Figure 6:
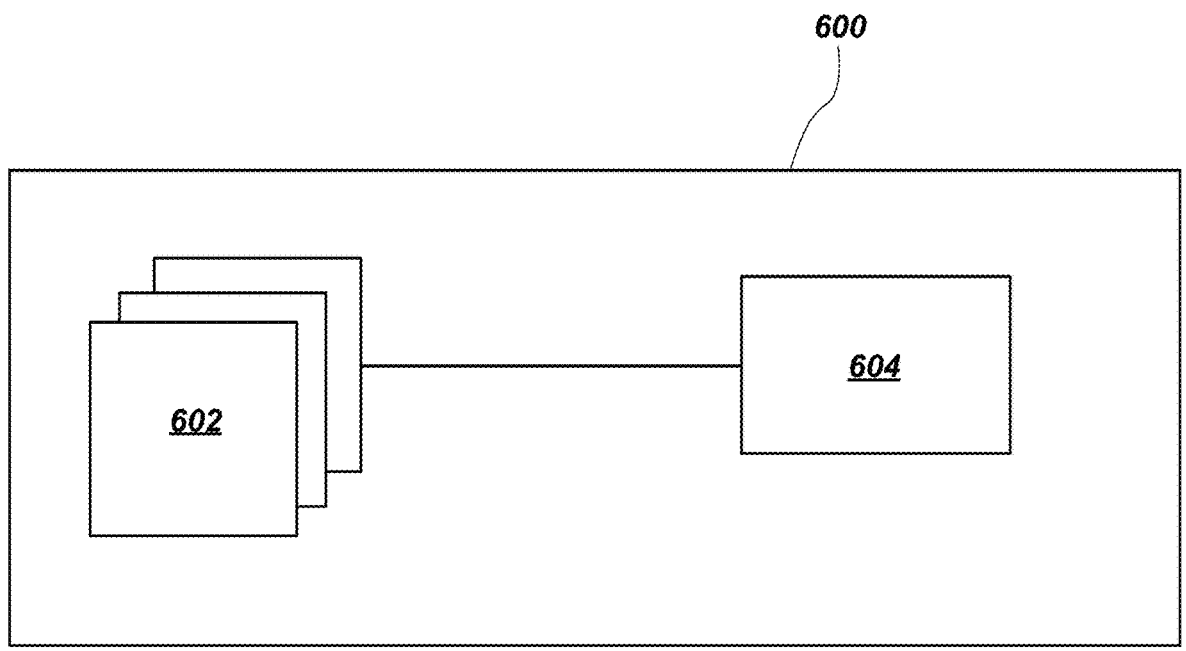
FIG. 6 is a functional block diagram of a memory device including a memory array comprising transistors in accordance with embodiments of the disclosure.

FIG. 6 illustrates a simplified block diagram of a memory device 600 in accordance with embodiments of the disclosure. The memory device 600 includes at least one memory cell having at least one semiconductor structure 150 (FIG. 5), such as a transistor, according to embodiments of the disclosure, as described above, in operative communication with a storage element. The semiconductor structure 150 may include a vertical TFT that acts as a switch for enabling and disabling current flow through the memory cell. The memory device 600 includes a memory array 602 comprising the memory cells and a control logic component 604. The memory array 602 may include multiple memory cells including the at least one semiconductor structure 150 according to embodiments of the disclosure. The control logic component 604 may be configured to operatively interact with the memory array 602 so as to read, write, or refresh any or all memory cells within the memory array 602. The memory device 600 including the semiconductor structure 150 may be formed by conducting additional process acts, which are not described in detail herein.

The semiconductor structure 150 (FIG. 5) or portions thereof may be incorporated in memory structures, memory cells, arrays including the memory cells, memory devices, switching devices, other semiconductor devices including the arrays, and systems including the arrays. Embodiments of the semiconductor structure 150 may be used in a variety of memory cells (e.g., volatile memory, non-volatile memory) and/or transistor configurations. Non-limiting examples include random-access memory (RAM), read-only memory (ROM), dynamic random-access memory (DRAM), synchronous dynamic random-access memory (SDRAM), flash memory, resistive random-access memory (ReRAM), conductive bridge random-access memory (conductive bridge RAM), magnetoresistive random-access memory (MRAM), phase change material (PCM) memory, phase change random-access memory (PCRAM), spin-torque-transfer random-access memory (STTRAM), oxygen vacancy-based memory, programmable conductor memory, ferroelectric random-access memory (FE-RAM), reference field-effect transistors (RE-FET), etc.

Accordingly, a memory device is disclosed, which includes at least one thin-film transistor and a storage element in operative communication with the at least one thin-film transistor. The at least one thin-film transistor comprises crystalline pillars. Each crystalline pillar comprises a first crystalline material in contact with a second crystalline material. Each of the first crystalline material and the second crystalline material comprise at least one element selected from the group consisting of silicon and germanium. Each crystalline pillar is laterally isolated from each adjacent crystalline pillar, and the first crystalline material in each pillar is in single crystalline form.

Figure 7:
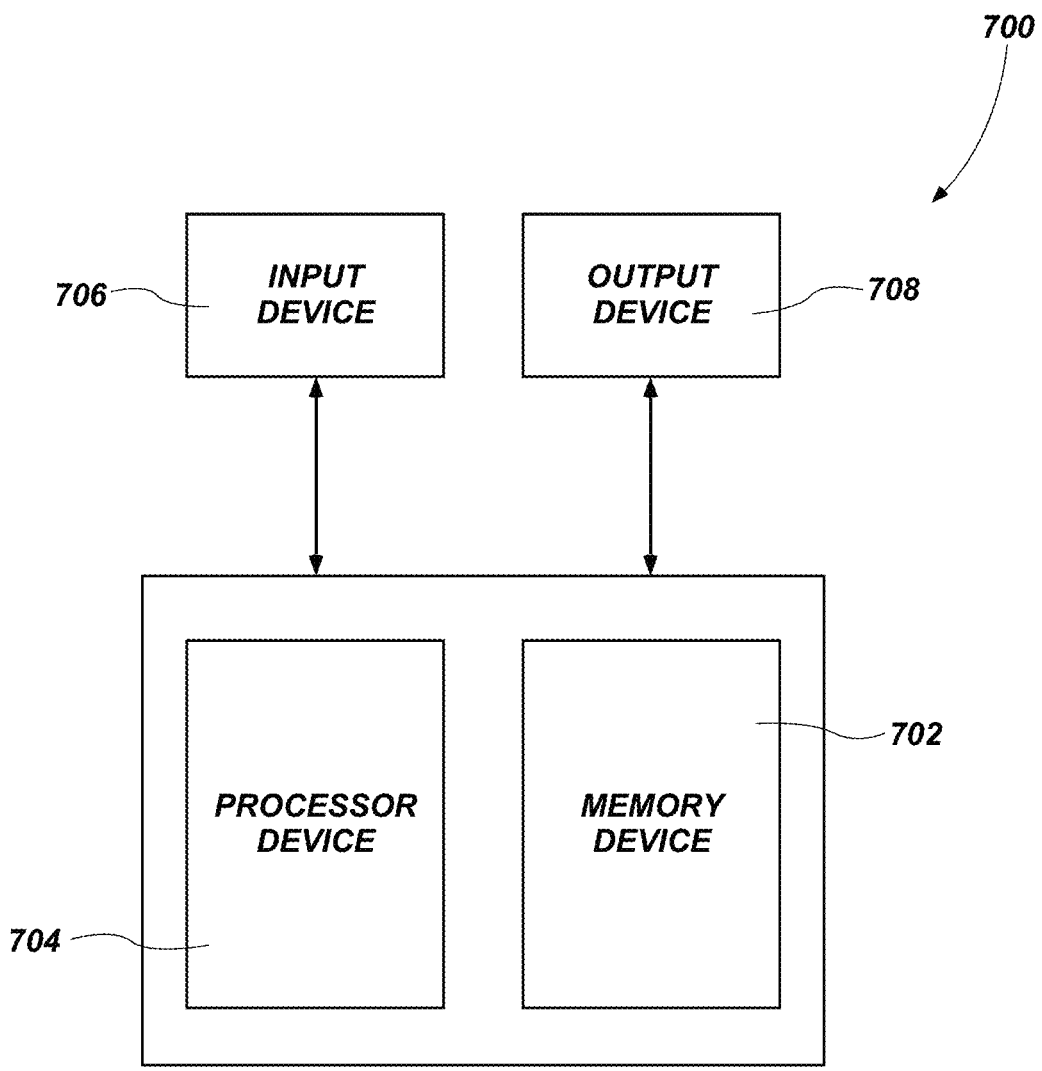
FIG. 7 is a schematic block diagram illustrating an electronic system including semiconductor devices comprising at least one transistor in accordance with embodiments of the disclosure.

The memory device 600 including the semiconductor structure 150 may be used in an electronic system 700 as shown in FIG. 7. The electronic system 700 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet such as, for example, an iPad® or SURFACE® tablet, an electronic book, a navigation device, etc. The electronic system 700 includes at least one memory device 702, which includes at least one semiconductor device including memory cells having at least one semiconductor structure (e.g., a vertical TFT) as previously described. The electronic system 700 may further include at least one electronic signal processor device 704 (often referred to as a "microprocessor"). The electronic signal processor device 704 may, optionally, include at least one semiconductor structure as previously described. The electronic system 700 may further include one or more input devices 706 for inputting information into the electronic system 700 by a user, such as, for example, a mouse or other pointing device, a keyboard, a touchpad, a button, or a control panel. The electronic system 700 may further include one or more output devices 708 for outputting information (e.g., visual or audio output) to a user such as, for example, a monitor, a display, a printer, an audio output jack, a speaker, etc. In some embodiments, the input device 706 and the output device 708 may comprise a single touchscreen device that can be used both to input information to the electronic system 700 and to output visual information to a user. The one or more input devices 706 and output devices 708 may communicate electrically with at least one of the memory device 702 and the electronic signal processor device 704.

Accordingly, a system is disclosed that, in some embodiments, comprises memory including memory cells comprising at least one vertical thin-film transistor. A processor is in operative communication with at least one input device, at least one output device, and the memory. The at least one vertical thin-film transistor comprises pillars. Each pillar is laterally isolated from each adjacent pillar. Each pillar comprises a portion of a first material and a portion of a second material over and in contact with the portion of the first material. Each of the first material and the second material comprise at least one element selected from the group consisting of silicon and germanium. The second material exhibits a composition different than a composition of the first material. The portion of the first material in each pillar is in single crystalline form.

The following examples serve to explain embodiments of the invention in more detail. These examples are not to be construed as being exhaustive or exclusive as to the scope of this invention.

EXAMPLES

Example 1

Solid Phase Crystallization of Pillars

Figure 8:
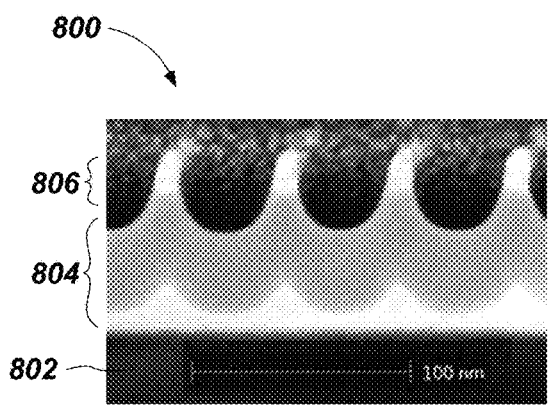
FIG. 8 is an image obtained via scanning transmission electron microscopy (STEM) of a cross-section of a structure formed according to embodiments of the disclosure.

Amorphous SiGe having a thickness of about 600 Å was formed on a wafer. Amorphous $Si_{0.2}Ge_{0.8}$ having a thickness of about 250 Å was formed over the amorphous SiGe. The structure was etched to remove some of each material and form pillars. The opening separating the pillars was filled with an oxide. FIG. 8 shows an image obtained via scanning transmission electron microscopy (STEM) of a cross-section of the structure 800 so formed. An oxide layer 802 on the wafer appears near the bottom of the image, with the SiGe material 804, and the $Si_{0.2}Ge_{0.8}$ material 806 thereon.

Figure 9:
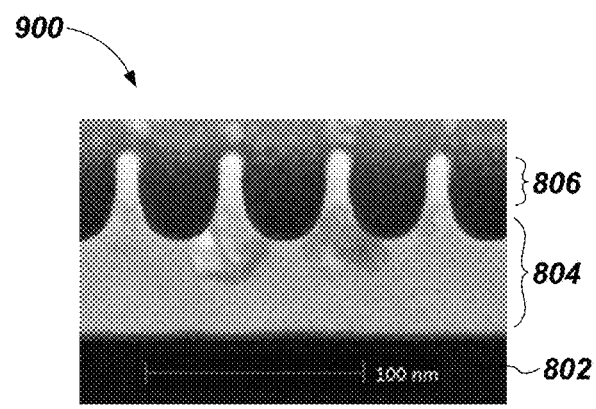
FIG. 9 is an image obtained via STEM of the structure shown in FIG. 8 after annealing.
Figure 10:
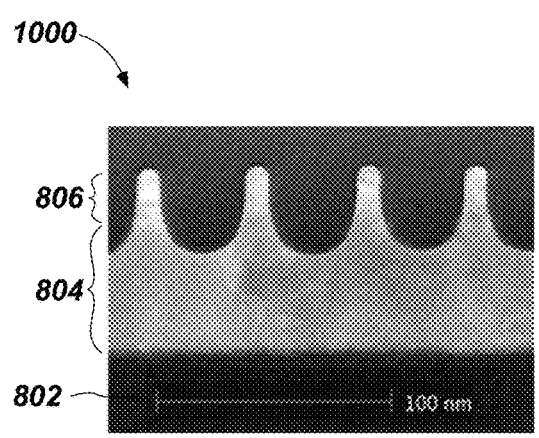
FIG. 10 is an image obtained via STEM of the structure shown in FIG. 9 after additional annealing.

The structure 800 was placed in a chamber and annealed in a nonoxidizing environment at 600° C., a temperature higher than the crystallization temperature of $Si_{0.2}Ge_{0.8}$ but lower than the crystallization temperature of SiGe. FIG. 9 shows a STEM image of a cross-section of the structure 900 that was formed after one minute of annealing, and FIG. 10 shows a STEM image of a cross-section of the structure 1000 that was formed after ten minutes of annealing.

As shown in FIG. 9, a crystalline structure has begun to form in the material 806, and has begun propagating downward toward the material 804. The grains in the two pillars in the middle of FIG. 9 appear to be growing more rapidly than the grains in the outer pillars. As shown in FIG. 10, the grains of the two middle pillars, as well as the grain of the pillar on the right, propagated downward into the material 804. It appears that the material 804 in each of these three pillars is in single-crystalline form. The pillar on the left did not appear to form single-crystalline material. Without being bound to any particular theory, it appears that no crystalline structure in the material 806 of that pillar formed predominantly over the others. Thus, due to the competing grain structures, no single crystal structure was present and formed the material 804 of that pillar into single-crystalline form. Nonetheless, the other three pillars appeared to be free of polycrystalline and amorphous defects.

Comparative Example 2

Solid Phase Crystallization of Stack Without Pillars

Amorphous SiGe having a thickness of about 600 Å was formed on a wafer. Amorphous $Si_{0.2}Ge_{0.8}$ having a thickness of about 250 Å was formed over the SiGe.

Figure 11:
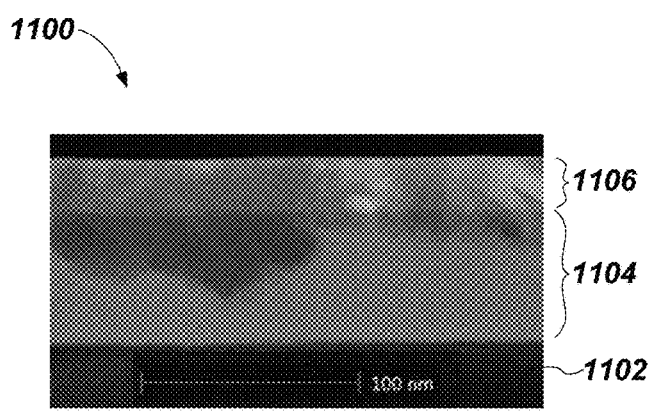
FIG. 11 is an image obtained via STEM of a cross-section of an annealed structure formed by conventional methods.
Figure 12:
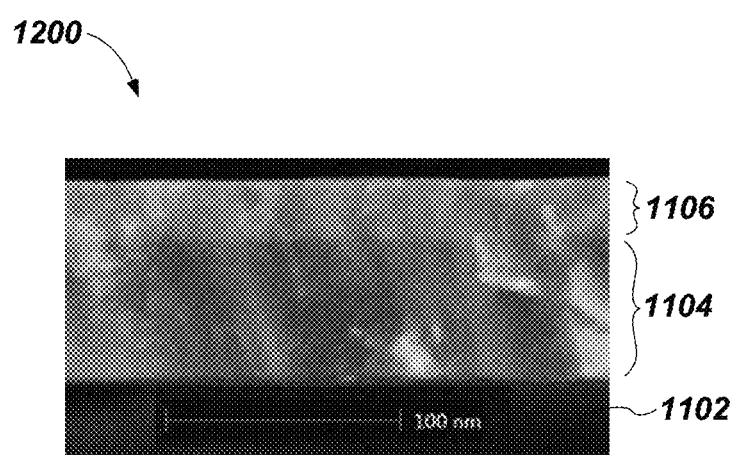
FIG. 12 is an image obtained via STEM of the structure shown in FIG. 11 after additional annealing.

The structure was placed in a chamber and annealed in a nonoxidizing environment at 600° C., a temperature higher than the crystallization temperature of $Si_{0.2}Ge_{0.8}$ but lower than the crystallization temperature of SiGe. FIG. 11 shows a STEM image of a cross-section of the structure 1100 that was formed after one minute of annealing, and FIG. 12 shows a STEM image of a cross-section of the structure 1200 that was formed after ten minutes of annealing. An oxide layer 1102 on the wafer appears near the bottom of the images, with the SiGe material 1104, and the $Si_{0.2}Ge_{0.8}$ material 1106 thereon.

The growth of crystalline material began from the top down, and the lighter-colored, bottom portion of the material 1104 shown in FIG. 11 was amorphous. As shown in FIG. 12, the material 1104 after ten minutes of annealing was polycrystalline, and contained a wide distribution of grain sizes and orientations. Thus, even if the structure 1200 were etched to form pillars, the resulting pillars would not have been single-crystalline.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
   crystalline pillars, each crystalline pillar comprising a portion of a first material and a portion of a second material over and in contact with the portion of the first material, wherein each of the first material and the second material comprise at least one element selected from the group consisting of silicon and germanium, and wherein the second material exhibits a composition different than a composition of the first material;
   wherein:
   each crystalline pillar is laterally isolated from each adjacent crystalline pillar;
   the portion of the first material in each pillar is in single crystalline form; and
   each crystalline pillar comprises a continuous crystalline structure that includes the portion of the first material and the portion of the second material.

2. The electronic device of claim 1, wherein each of the first material and the second material independently exhibits a thickness between about 100 Å and about 10 μm.

3. The electronic device of claim 1, further comprising a blocking material between the crystalline pillars.

4. The electronic device of claim 3, wherein the blocking material comprises a material selected from the group consisting of an oxide, a nitride, and a carbon-containing material.

5. The electronic device of claim 1, further comprising a dopant in at least one material selected from the group consisting of the first material and the second material.

6. The electronic device of claim 5, wherein the dopant comprises an element selected from the group consisting of boron, arsenic, and phosphorus.

7. The electronic device of claim 1, wherein the crystalline pillars are disposed on a base material.

8. The electronic device of claim 1, wherein the crystalline pillars exhibit a height of at least about 400 Å.

9. The electronic device of claim 1, wherein the crystalline pillars exhibit a height of at least about 600 Å.

10. The electronic device of claim 1, wherein each crystalline pillar comprises an annealed structure.

11. A memory device, comprising:
    at least one thin-film transistor and a storage element in operative communication with the at least one thin-film transistor, the at least one thin-film transistor comprising:

crystalline pillars, each crystalline pillar comprising a first crystalline material in contact with a second crystalline material, wherein each of the first crystalline material and the second crystalline material comprise at least one element selected from the group consisting of silicon and germanium; and a blocking material extending continuously between adjacent crystalline pillars, a height of the blocking material substantially equal to a height of the crystalline pillars;

wherein each crystalline pillar is laterally isolated from each adjacent crystalline pillar, the first material in each crystalline pillar is in single crystalline form, and wherein one or more of the crystalline pillars of the memory device comprises a different grain structure and orientation than another of the crystalline pillars.

12. The memory device of claim 11, wherein the second crystalline material exhibits a composition different than a composition of the first crystalline material.

13. The memory device of claim 11, wherein the memory device comprises at least one memory cell selected from the group consisting of random-access memory (RAM), read-only memory (ROM), dynamic random-access memory (DRAM), synchronous dynamic random-access memory (SDRAM), flash memory, resistive random-access memory (ReRAM), conductive bridge random-access memory (conductive bridge RAM), magnetoresistive random-access memory (MRAM), phase change material (PCM) memory, phase change random-access memory (PCRAM), spin-torque-transfer random-access memory (STTRAM), oxygen vacancy-based memory, programmable conductor memory, ferroelectric random-access memory (FE-RAM), and reference field-effect transistors (RE-FET).

14. The memory device of claim 11, wherein the first crystalline material and the second crystalline material exhibit a single crystalline structure along a height thereof.

15. The memory device of claim 11, wherein the first crystalline material and the second crystalline material exhibit a single crystal orientation along a height thereof.

16. A system, comprising:
memory including memory cells comprising at least one vertical thin-film transistor, the at least one vertical thin-film transistor comprising:
pillars in single crystalline form, each pillar comprising a portion of a first material and a portion of a second material over and in contact with the portion of the first material, the pillars comprising a continuous crystalline structure that includes the portion of the first material and the portion of the second material, wherein each of the first material and the second material comprise at least one element selected from the group consisting of silicon and germanium, and wherein the second material exhibits a composition different than a composition of the first material;
wherein:
each pillar is laterally isolated from each adjacent pillar and
each pillar exhibits a height of at least about 400 Å; and
a processor in operative communication with at least one input device, at least one output device, and the memory.

17. The system of claim 16, wherein the at least one vertical thin-film transistor is substantially free of amorphous silicon and amorphous germanium.

18. The system of claim 16, wherein the composition of the second material comprises different elements than the composition of the first material.

19. The system of claim 16, wherein the composition of the second material comprises different ratios of elements than the composition of the first material.

* * * * *